(12) United States Patent
Chiu et al.

(10) Patent No.: US 11,631,793 B2
(45) Date of Patent: Apr. 18, 2023

(54) LIGHT-EMITTING HOUSING

(71) Applicant: PEGATRON CORPORATION, Taipei (TW)

(72) Inventors: Yu-Hao Chiu, Taipei (TW); Tzu-Ming Yang, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 354 days.

(21) Appl. No.: 16/994,421

(22) Filed: Aug. 14, 2020

(65) Prior Publication Data

US 2021/0091284 A1 Mar. 25, 2021

(30) Foreign Application Priority Data

Sep. 25, 2019 (TW) .................................. 108134556

(51) Int. Cl.
*H01L 33/62* (2010.01)
(52) U.S. Cl.
CPC .................................... *H01L 33/62* (2013.01)
(58) Field of Classification Search
CPC ..................................................... H01L 33/62
See application file for complete search history.

(56) References Cited

U.S. PATENT DOCUMENTS

| 6,547,417 | B2 * | 4/2003 | Lee | F21V 19/04 |
| | | | | 362/184 |
| 2011/0013400 | A1 * | 1/2011 | Kanno | F21V 23/06 |
| | | | | 439/78 |

FOREIGN PATENT DOCUMENTS

| CN | 201976366 | 9/2011 |
| CN | 204993505 | 1/2016 |
| CN | 209435272 | 9/2019 |
| JP | 2010182602 | 8/2010 |
| TW | 381766 | 2/2000 |
| TW | 200427137 | 12/2004 |
| TW | 200922043 | 5/2009 |

* cited by examiner

*Primary Examiner* — Peniel M Gumedzoe
(74) *Attorney, Agent, or Firm* — J.C. Patents

(57) ABSTRACT

A light-emitting housing including a housing body, a conductive structure, and a light-emitting element is provided. The housing body has an outer surface and an inner surface. The conductive structure is embedded in the housing body and penetrates the outer surface and the inner surface. A decorative film is attached to the outer surface of the housing body. The light-emitting element is disposed on the outer surface of the housing body. The light-emitting element has two wires coupled to the conductive structure. The electric structure is adapted to transmit a current to the two wires, so that the light-emitting element emits light.

9 Claims, 6 Drawing Sheets

LIGHT-EMITTING HOUSING

CROSS-REFERENCE TO RELATED APPLICATION

This application claims the priority benefit of Taiwan application Ser. No. 108134556, filed on Sep. 25, 2019. The entirety of the above-mentioned patent application is hereby incorporated by reference herein and made a part of this specification.

BACKGROUND

Technical Field

The invention relates to a housing, and particularly relates to a light-emitting housing having a decorative effect and a light-emitting function.

Related Art

Light-emitting housing of the prior art is mainly to form a hole corresponding to a light-emitting region on a product housing in a drilling manner to allow light of an internal light source to emit out, and when an electronic product is operated, the light of the internal light source may be transmitted to human eyes from the hole of the product housing to provide a visual effect. Moreover, drilling may reduce strength of the product housing, so that it is necessary to use a housing of a certain thickness, which is of no avail for meeting a demand of light and thin of products.

SUMMARY

The invention is directed to a light-emitting housing, which is capable of generating light to achieve a decorative effect and a visual effect when a current flows through, and is capable of avoiding a large-scale drilling step to reduce difficulty on manufacturing.

The invention provides a light-emitting housing including a housing body, a conductive structure, and a light-emitting element. The housing body includes an outer surface and an inner surface. The conductive structure is embedded in the housing body and penetrates the outer surface and the inner surface. A decorative film is attached on the outer surface of the housing body. The light-emitting element is disposed on the outer surface of the housing body.

The light-emitting element includes two wires coupled to the conductive structure. The conductive structure is adapted to transmit a current to the two wires, so that the light-emitting element emits light.

In an embodiment of the invention, the conductive structure includes two metal pillars, the housing body includes two through holes, each of the through holes penetrates the inner surface and the outer surface, and the two metal pillars are respectively inserted into the two through holes.

In an embodiment of the invention, each of the metal pillars includes a first coupling surface and a second coupling surface, the first coupling surface is aligned with the outer surface of the housing body and is coupled to the corresponding wire, and a width of the second coupling surface is greater than an inner diameter of each of the through holes and protrudes from the inner surface.

In an embodiment of the invention, the light-emitting housing further includes a power supply disposed on the inner surface of the housing body for supplying the current, wherein the power supply includes two electric wires extending toward the conductive structure, and the two electric wires are respectively coupled to the two second coupling surfaces of the two metal pillars.

In an embodiment of the invention, the housing body is made of a metal material and includes a through hole, the through hole penetrates the inner surface and the outer surface, the conductive structure includes an insulating gasket and two metal pillars, the insulating gasket is inserted into the through hole, and the two metal pillars are inserted into the insulating gasket to isolate from the housing body.

In an embodiment of the invention, each of the metal pillars includes a first coupling surface and a second coupling surface, a first surface of the insulating gasket and each of the first coupling surfaces are aligned with the outer surface of the housing body, and a second surface of the insulating gasket and each of the second coupling surfaces protrude from the inner surface.

In an embodiment of the invention, the insulating gasket includes two stepped holes spaced apart from each other, and the two metal pillars are respectively embedded in the two stepped holes.

In an embodiment of the invention, each of the stepped holes has a first inner diameter and a second inner diameter, and the first inner diameter facing the outer surface is smaller than the second inner diameter facing the inner surface.

In an embodiment of the invention, the light-emitting housing further includes a decorative film attached on the outer surface of the housing body, the light-emitting element is formed on the decorative film by ink printing and the light-emitting element is located between the decorative film and the outer surface.

In an embodiment of the invention, the two wires of the light-emitting element are formed on the decorative film, and ends of the two wires are coupled to the conductive structure.

Based on the above description, the light-emitting housing of the invention has the conductive structure penetrating the outer surface and the inner surface of the housing body, and when the light-emitting element is disposed on the outer surface of the housing body, the two wires of the light-emitting element contact the conductive structure for conductive purposes. In addition, the power supply on the inner surface and the conductive structure are connected in a welding manner, so that a purpose of electrically connecting the power supply and the light-emitting element is achieved.

Further, the light-emitting housing of the invention has a visual effect through the light-emitting element, and compared with the light-emitting housing of the prior art that emits light through the drilling manner, the light-emitting element of the invention is directly arranged outside the housing body to avoid a large-scale drilling step, so that strength of the product housing is not reduced and manufacturing difficulty of the light-emitting housing is reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE EMBODIMENTS

Figure 1A:
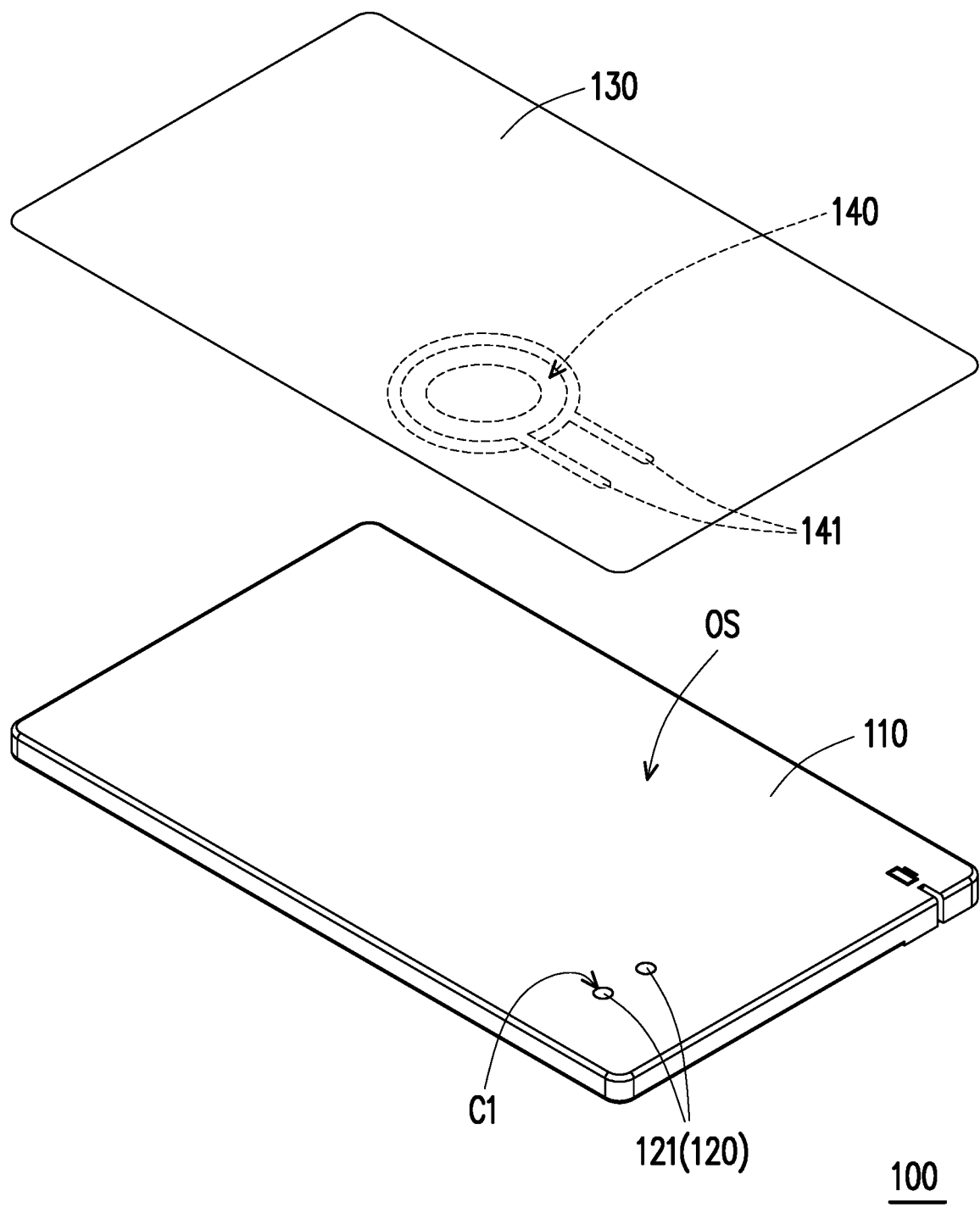
FIG. 1A is a schematic three-dimensional exploded view of a part of components of a light-emitting housing according to an embodiment of the invention.
Figure 1B:
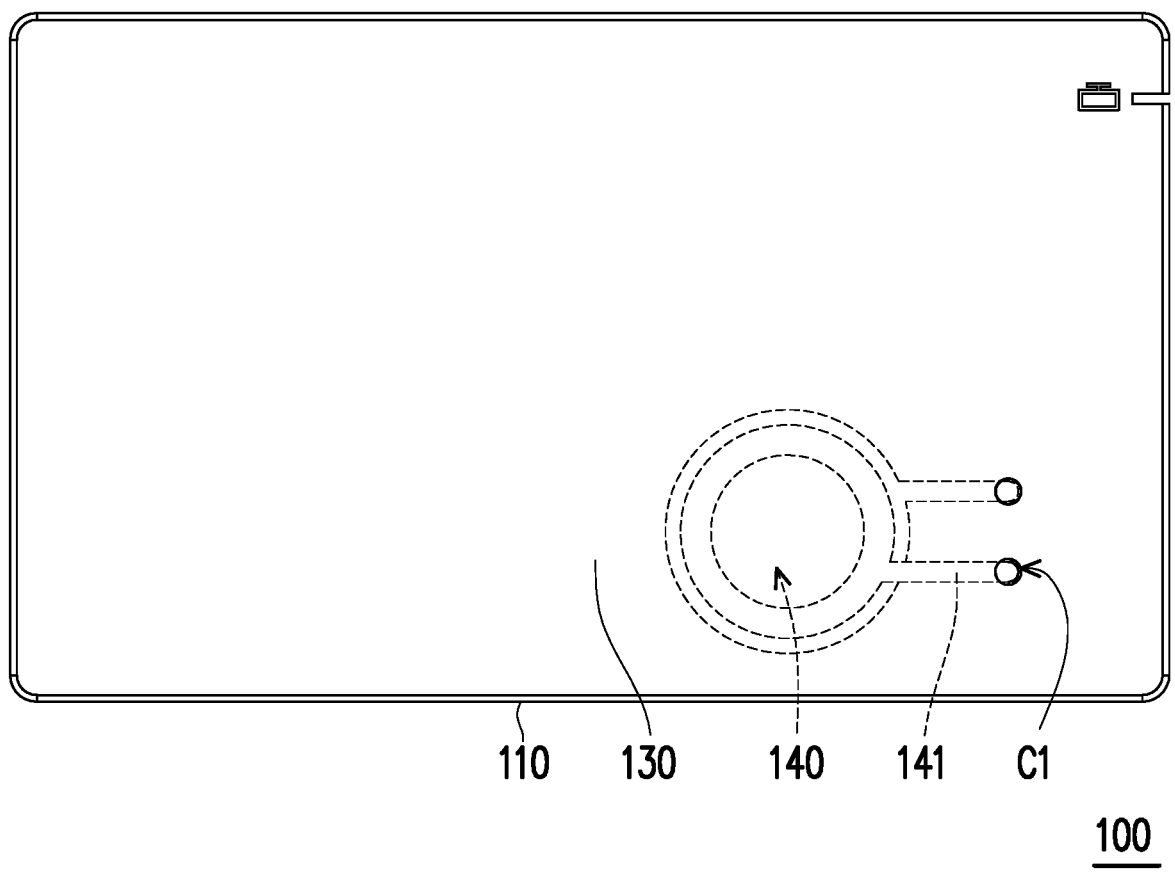
FIG. 1B is a schematic top plan view of a light-emitting element of FIG. 1A attached to a housing body.
Figure 1C:
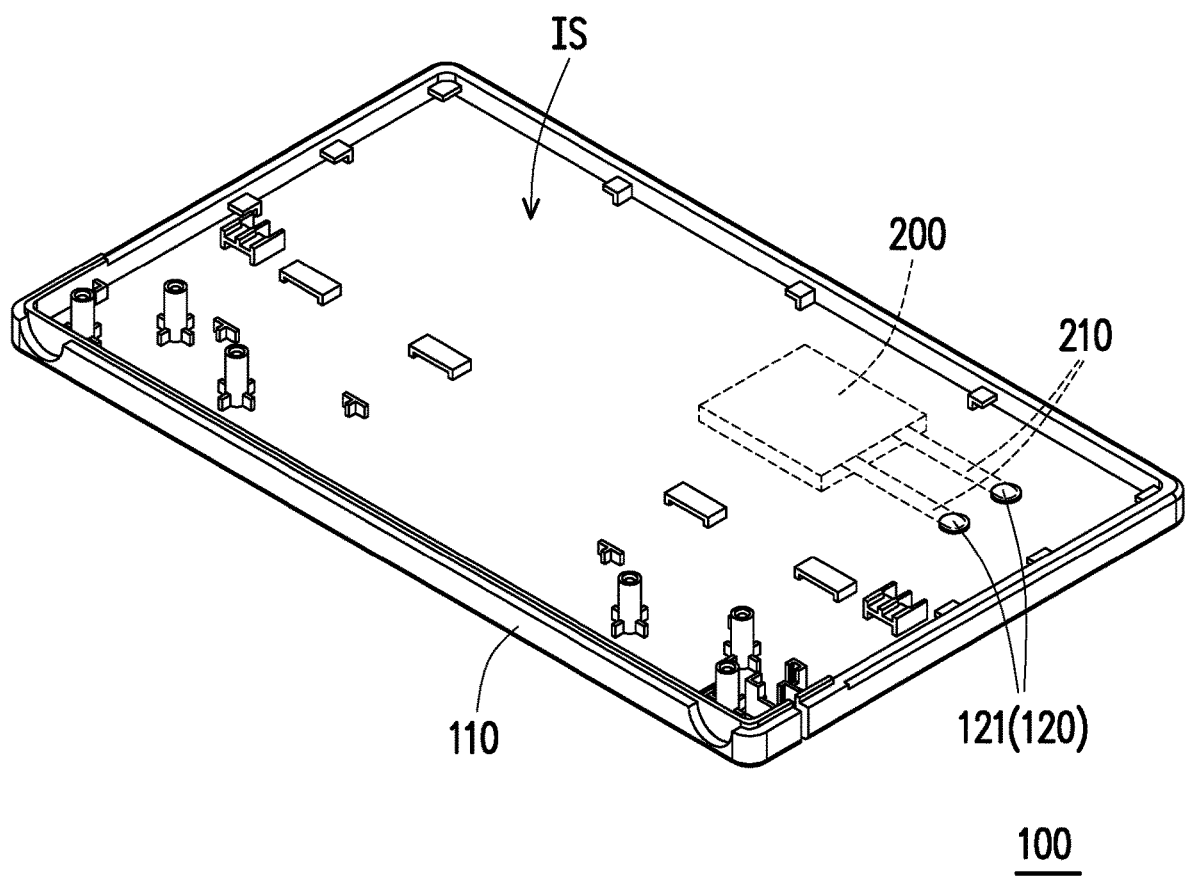
FIG. 1C is a schematic three-dimensional view of the light-emitting housing of FIG. 1A viewed from another direction.
Figure 2A:
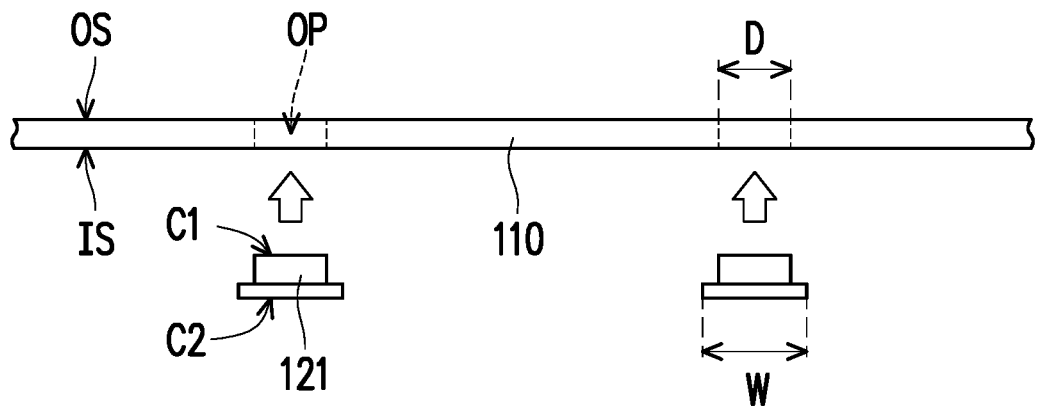
FIG. 2A is a schematic plan view of a separated state of a conductive structure and the housing body of FIG. 1A.
Figure 2B:
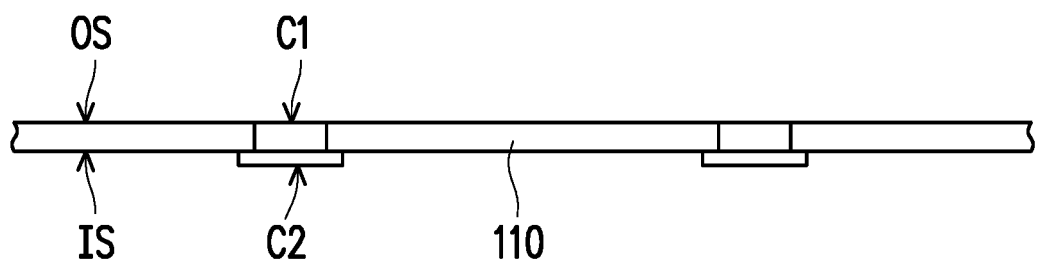
FIG. 2B is a schematic plan view of an embedded state of the conductive structure and the housing body of FIG. 2A.

FIG. 1A is a schematic three-dimensional exploded view of a part of components of a light-emitting housing according to an embodiment of the invention. FIG. 1B is a schematic top plan view of a light-emitting element of FIG. 1A attached to a housing body. FIG. 1C is a schematic three-dimensional view of the light-emitting housing of FIG. 1A viewed from another direction. FIG. 2A is a schematic plan view of a separated state of a conductive structure and the housing body of FIG. 1A. FIG. 2B is a schematic plan view of a fitted state of the conductive structure and the housing body of FIG. 2A.

Referring to FIG. 1A to FIG. 1C, a light-emitting housing 100 of the invention is, for example, a housing structure of a notebook computer, a tablet computer, a mobile phone, a household appliance, a projector, or other similar electronic devices. The light-emitting housing 100 includes a light-emitting element, and when a current flow through, the light-emitting element emits light to achieve decorative and visual effects.

The light-emitting housing 100 of the invention includes a housing body 110, a conductive structure 120, a light-emitting element 140, and a decorative film 130.

The housing body 110 is, for example, made of plastic or other insulating materials. The housing body 110 includes an outer surface OS and an inner surface IS. The conductive structure 120 is embedded in the housing body 110 and penetrates the outer surface OS and the inner surface IS.

Referring to FIG. 2A and FIG. 2B, in detail, the conductive structure 120 includes two metal pillars 121, and the housing body 110 includes two through holes OP, and each of the through holes OP penetrates the inner surface IS and the outer surface OS. The two metal pillars 121 are respectively inserted into the two through holes OP. Each of the metal pillars 121 includes a first coupling surface C1 and a second coupling surface C2. Each of the first coupling surfaces is aligned with the outer surface OS of the housing body 110, and a width W of the second coupling surface C2 is greater than an inner diameter D of each through hole OP and protrudes from the inner surface IS of the housing body 110.

In other embodiments, the width W of each of the second coupling surfaces C2 is equal to the inner diameter D of each through hole OP, and is aligned with the inner surface IS of the housing body 110, which depends on a housing structure and requirements of a wiring space, and is not limited by the invention.

The light-emitting element 140 is disposed on the outer surface OS of the housing body 110. The light-emitting element 140 includes two wires 141 respectively coupled to the two metal pillars 121 of the conductive structure 120. Referring to FIG. 1A and FIG. 1C, the two wires 141 of the light-emitting element 140 are formed on the decorative film 130, and the ends of the two wires 141 are respectively coupled to the two first coupling surfaces C1 of the two metal pillars 121 of the conductive structure 120 to achieve electrical conduction. In brief, the two wires 141 of the light-emitting element 140 of the invention are located on the first coupling surfaces C1 of the corresponding metal pillars 121 to achieve mutual contact and electrical conduction.

The decorative film 130 is attached on the outer surface OS of the housing body 110. The light-emitting element 140 is formed on the decorative film 130 by ink printing, and the light-emitting element 140 is located between the decorative film 130 and the outer surface OS of the housing body 110. The decorative film 130 may be made of a material with a hairline on the surface, a three-dimensional touch feeling, a metallic texture, or other special appearance to enhance an aesthetic degree of the housing body 110. In the embodiment, the decorative film 130 is attached to the outer surface OS of the housing 110 by heating and vacuum forming.

In detail, the light-emitting element 140, for example, adopts a cold light plate, and includes a transparent electrode, a light-emitting layer, a dielectric layer, a back electrode, and an insulating layer, and is formed on the decorative film 130 by printing, where the transparent electrode is first printed on the decorative film 130, and the light-emitting layer, the dielectric layer, the back electrode, and the insulating layer are sequentially printed on the decorative film 130. The insulating layer is used for isolating the outer surface OS of the housing body 110 and the back electrode to avoid electrical interference. The light-emitting layer may emit light after being powered. The dielectric layer serves as a polarizable insulator between the back electrode and the light-emitting layer. The transparent electrode and the back electrode may serve as the two wires 141 of the light-emitting element 140 for coupling the power supply to form a loop.

By applying an alternating current to the two electrodes of the cold light plate, an electric field is generated and a fluorescent substance in the cold light plate is excited to emit light. The cold light plate may be combined with different kinds of substances to produce different colors of light. The cold light plate has characteristics different from that of a point light source or a linear light source of the existing light-emitting diodes, and the cold light plate is a uniform planar light source and has a small structural thickness, which may mitigate a disadvantage of uneven light distribution of the light-emitting diodes and occupy less space. Moreover, a light-emitting region of the light-emitting element 140 may be designed as a logo, an image, a text or other specific graphics according to actual needs, and the light-emitting element 140 may be composed of light-emitting regions of multiple colors, so as to simultaneously display multiple colors of light.

Referring to FIG. 1C, in the embodiment, a power supply 200 is disposed on the inner surface IS of the housing body 110. In other embodiments, the power supply 200 may also be disposed outside the housing body 110 or on another housing body, and the position of the power supply 200 is not limited by the invention. The power supply 200 is, for example, a circuit board, an integrated circuit, or other devices capable of supplying an alternating current. The power supply 200 is coupled to the conductive structure 120, and a current (for example, an alternating current) of the power supply 200 is adapted to be transmitted from the conductive structure 120 to the two wires 141 of the light-emitting element 140, and the light-emitting element 140 excites the fluorescent substance to emit light. In detail, the power supply 200 includes two electric wires 210 disposed on the inner surface IS of the housing body 110 and respectively coupled to the two second coupling surfaces C2 of the two metal pillars 121. In this way, the power supply 200 may be connected to the light-emitting element 140 through the two metal pillars 121 to facilitate supplying a current to the light-emitting element 140.

In addition, electrical coupling steps of the light-emitting element 140, the conductive structure 120 and the power supply 200 may be adjusted according to a process of appearance surface treatment, where the corresponding metal pillars 121 may be first welded to the electric wires 210 before fixing the metal pillars 121 to the housing body 110. Then, the decorative film 130 and the light-emitting element 140 are aligned and attached to the outer surface OS of the housing body 110. A sequence of the above steps may be adjusted according to actual situations.

Figure 3A:
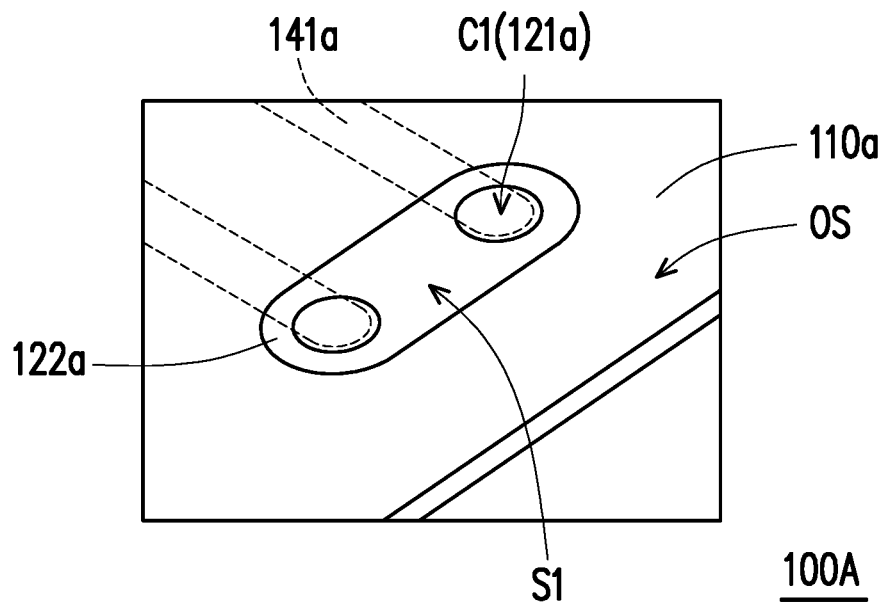
FIG. 3A is a schematic three-dimensional enlarged view of a light-emitting housing adopting an insulating gasket according to another embodiment of the invention.
Figure 3B:
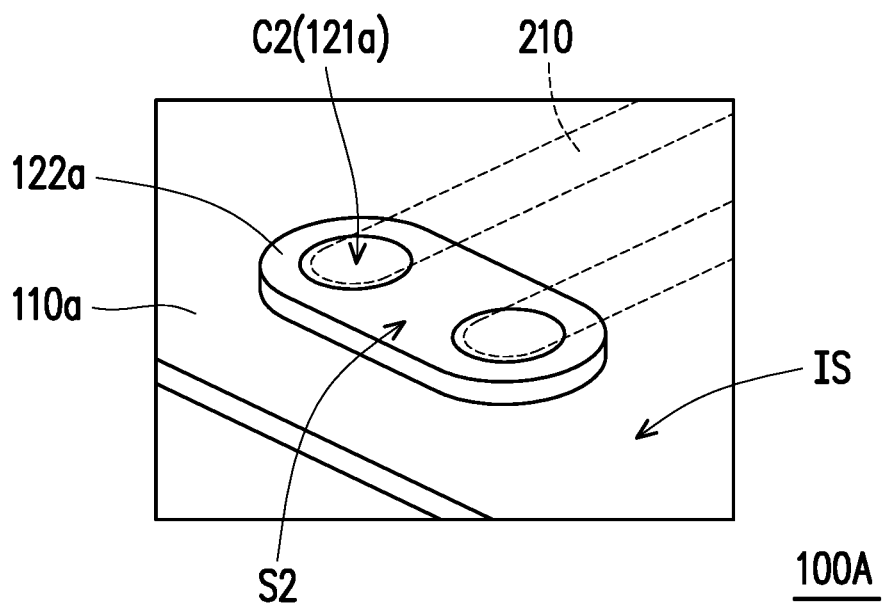
FIG. 3B is schematic three-dimensional enlarged view of the light-emitting housing of FIG. 3A viewed from another direction.
Figure 4A:
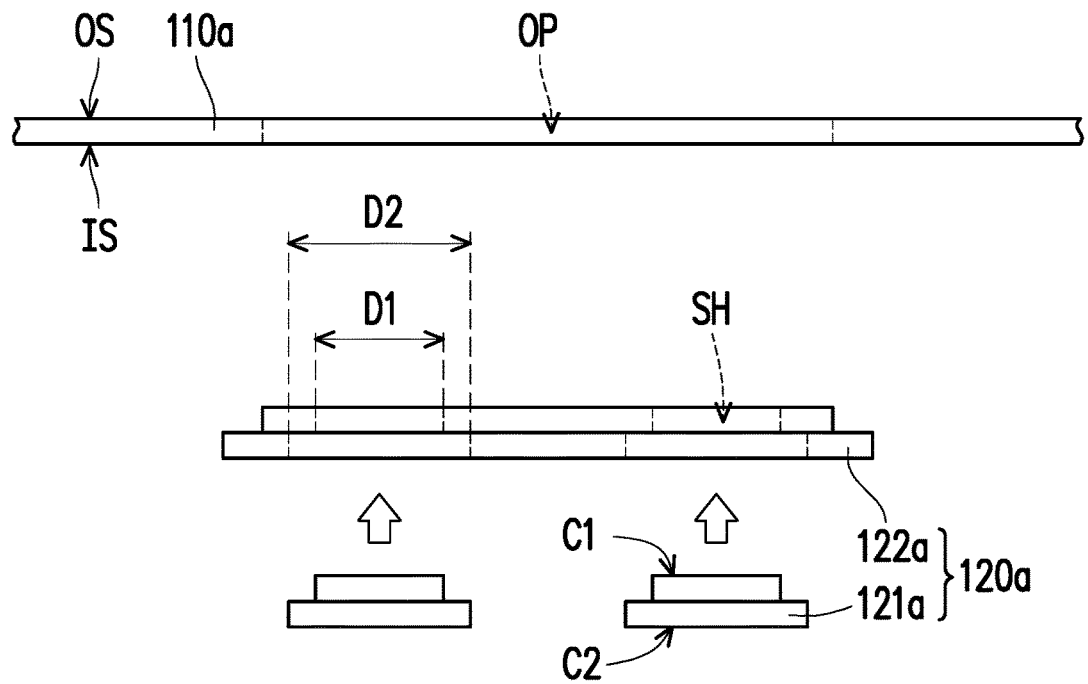
FIG. 4A is a schematic plan view of a separated state of the insulating gasket, a conductive structure and a housing body of FIG. 3A.
Figure 4B:
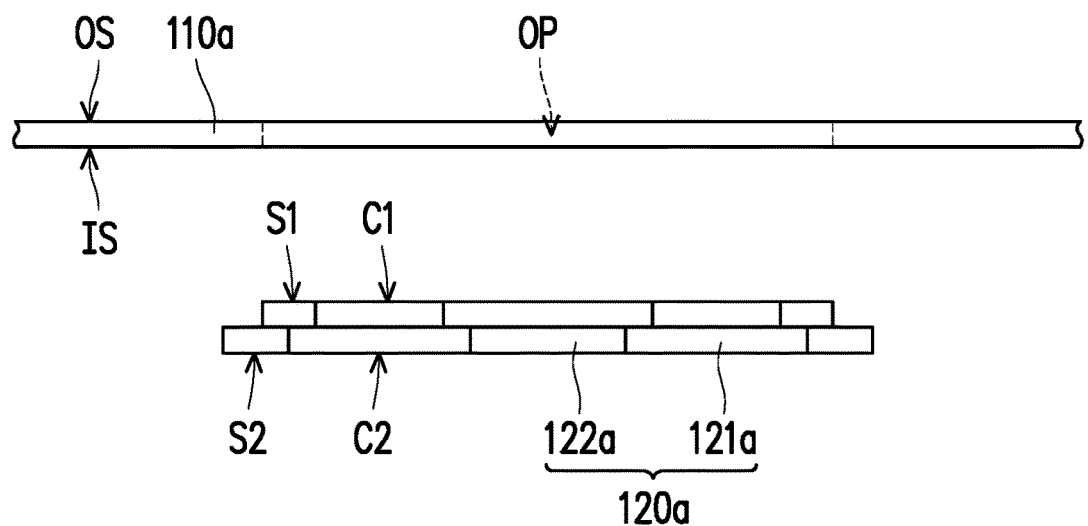
FIG. 4B is a schematic plan view of a fitted state of the insulating gasket, the conductive structure and the housing body of FIG. 4A.

FIG. 3A is a schematic three-dimensional enlarged view of a light-emitting housing adopting an insulating gasket according to another embodiment of the invention. FIG. 3B is schematic three-dimensional enlarged view of the light-emitting housing of FIG. 3A viewed from another direction. FIG. 4A is a schematic plan view of a separated state of the insulating gasket, a conductive structure and a housing body of FIG. 3A. FIG. 4B is a schematic plan view of a fitted state of the insulating gasket, the conductive structure and the housing body of FIG. 4A.

Referring to FIG. 3A and FIG. 3B, a light-emitting housing 100A of the embodiment is similar to the light-emitting housing 100 of FIG. 1A, and a differences there between is that a housing body 110a of the light-emitting housing 100A is made of a metal material and includes a through hole OP penetrating the inner surface IS and the outer surface OS of the housing body 110a. The conductive structure 120a includes an insulating gasket 122a and two metal pillars 121a. The insulating gasket 122a is inserted into the through hole OP of the housing body 110a, and the two metal pillars 121a are inserted into the insulating gasket 122a to isolate from the housing body 110a. Here, the insulating gasket 122a is used to isolate a contact between the metal pillars 121a and the housing body 110a to avoid a short circuit in case of power on or avoid a situation that the housing body 110a is fully charged to cause electric shock to a user.

Referring to FIG. 4A and FIG. 4B, a first surface 51 of the insulating gasket 122a and each of the first coupling surfaces C1 of each of the metal pillars 121a are aligned with the outer surface OS of the housing body 110a, and two wires 141a of the light-emitting element are respectively coupled to the two first coupling surfaces C1. A second surface S2 of the insulating gasket 122a and each of the second coupling surfaces C2 of each of the metal pillars 121a protrude from the inner surface IS of the housing body 110a, and the two electric wires 210 of the power supply are respectively coupled to the two second coupling surfaces C2.

The insulating gasket 122a includes two stepped holes SH spaced apart from each other, and the two metal pillars 121a are respectively fitted in the two stepped holes SH. Further, each of the stepped holes SH has a first inner diameter D1 and a second inner diameter D2, and the first inner diameter D1 facing the outer surface OS of the housing body 110a is smaller than the second inner diameter D2 facing the inner surface IS of the housing body 110a, so as to accommodate the first coupling surface C1 and the second coupling surface C2 of the metal pillar 121a.

In summary, the light-emitting housing of the invention has the conductive structure penetrating the outer surface and the inner surface of the housing body, and when the light-emitting element is disposed on the outer surface of the housing body, the two wires of the light-emitting element contact the conductive structure for conductive purposes. In addition, the power supply on the inner surface and the conductive structure are connected in a welding manner, so that a purpose of electrically connecting the power supply and the light-emitting element is achieved.

Further, the light-emitting housing of the invention has a visual effect through the light-emitting element, and compared with the light-emitting housing of the prior art that emits light through the drilling manner, the light-emitting element of the invention is directly arranged outside the housing body to avoid a large-scale drilling step, so that a strength of the product housing is not reduced and manufacturing difficulty of the light-emitting housing is reduced.

Further, the light-emitting housing of the invention adopts the two metal pillars of the conductive structure, which may reduce the material cost of a wire ink material of the light-emitting element for extending from the outer surface of the housing body to the inner surface of the housing body for coupling to the power supply.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A light-emitting housing, comprising:
   a housing body, comprising an outer surface and an inner surface;
   a conductive structure, embedded in the housing body and penetrating the outer surface and the inner surface; and
   a light-emitting element, disposed on the outer surface of the housing body and comprising two wires coupled to the conductive structure, wherein the conductive structure is adapted to transmit a current to the two wires, so that the light-emitting element emits light,
   wherein the conductive structure comprises two metal pillars, the housing body comprises two through holes, each of the through holes penetrates the inner surface and the outer surface, and the two metal pillars are respectively inserted into the two through holes.

2. The light-emitting housing as claimed in claim 1, wherein each of the metal pillars comprises a first coupling surface and a second coupling surface, the first coupling surface is aligned with the outer surface of the housing body and is coupled to one of the two wires, and a width of the second coupling surface is greater than an inner diameter of each of the through holes and protrudes from the inner surface.

3. The light-emitting housing as claimed in claim 2, further comprising a power supply, disposed on the inner surface of the housing body for supplying the current, wherein the power supply comprises two electric wires extending toward the conductive structure and the two electric wires are respectively coupled to the two second coupling surfaces of the two metal pillars.

4. The light-emitting housing as claimed in claim 1, further comprising a decorative film, attached on the outer surface of the housing body, wherein the light-emitting element is formed on the decorative film by ink printing and the light-emitting element is located between the decorative film and the outer surface.

5. The light-emitting housing as claimed in claim 4, wherein the two wires of the light-emitting element are formed on the decorative film and ends of the two wires are coupled to the conductive structure.

6. A light-emitting housing, comprising:
- a housing body, comprising an outer surface and an inner surface;
- a conductive structure, embedded in the housing body and penetrating the outer surface and the inner surface; and
- a light-emitting element, disposed on the outer surface of the housing body and comprising two wires coupled to the conductive structure, wherein the conductive structure is adapted to transmit a current to the two wires, so that the light-emitting element emits light,
- wherein the housing body is made of a metal material and comprises a through hole, the through hole penetrates the inner surface and the outer surface, the conductive structure comprises an insulating gasket and two metal pillars, the insulating gasket is inserted into the through hole, and the two metal pillars are inserted into the insulating gasket to isolate from the housing body.

7. The light-emitting housing as claimed in claim 6, wherein each of the metal pillars comprises a first coupling surface and a second coupling surface, a first surface of the insulating gasket and each of the first coupling surfaces are aligned with the outer surface of the housing body, and a second surface of the insulating gasket and each of the second coupling surfaces protrude from the inner surface.

8. The light-emitting housing as claimed in claim 6, wherein the insulating gasket comprises two stepped holes spaced apart from each other and the two metal pillars are respectively embedded in the two stepped holes.

9. The light-emitting housing as claimed in claim 8, wherein each of the stepped holes has a first inner diameter and a second inner diameter, and the first inner diameter facing the outer surface is smaller than the second inner diameter facing the inner surface.

* * * * *